(12) United States Patent
Zhao et al.

(10) Patent No.: US 8,333,615 B2
(45) Date of Patent: Dec. 18, 2012

(54) ROTATION AXIS, DIGITAL DEVICE AND USB DEVICE

(75) Inventors: Menglong Zhao, Shenzhen (CN); Jianjun Xiao, Shenzhen (CN)

(73) Assignee: Huawei Device Co., Ltd., Shenzhen (CN)

( * ) Notice: Subject to any disclaimer, the term of this patent is extended or adjusted under 35 U.S.C. 154(b) by 137 days.

(21) Appl. No.: 12/939,787

(22) Filed: Nov. 4, 2010

(65) Prior Publication Data

US 2011/0104954 A1    May 5, 2011

(30) Foreign Application Priority Data

Nov. 5, 2009    (CN) .................. 2009 2 0174431 U

(51) Int. Cl.
*H01R 24/00*    (2006.01)

(52) U.S. Cl. ........................................ 439/660

(58) Field of Classification Search .......... 439/660, 439/13, 164, 438
See application file for complete search history.

(56) References Cited

U.S. PATENT DOCUMENTS

| | | | |
|---|---|---|---|
| 6,394,813 B1* | 5/2002 | Stout et al. | 439/11 |
| 6,544,075 B1* | 4/2003 | Liao | 439/638 |
| 6,612,874 B1 | 9/2003 | Stout et al. | |
| 7,172,428 B2* | 2/2007 | Huang | 439/11 |
| 7,357,654 B2* | 4/2008 | Lin et al. | 439/164 |
| 7,824,186 B2* | 11/2010 | Zhao et al. | 439/13 |
| 2006/0084284 A1* | 4/2006 | Hsieh | 439/31 |
| 2006/0210060 A1 | 9/2006 | Ishikawa et al. | |
| 2007/0163082 A1 | 7/2007 | Chen et al. | |
| 2008/0286985 A1 | 11/2008 | Huang | |
| 2009/0215284 A1* | 8/2009 | Zhao et al. | 439/55 |

FOREIGN PATENT DOCUMENTS

| | | |
|---|---|---|
| CN | 2645359 Y | 9/2004 |
| CN | 2895853 Y | 5/2007 |

(Continued)

OTHER PUBLICATIONS

Extended European Search Report in corresponding European Application No. 10190074.4 (May 16, 2011).

(Continued)

*Primary Examiner* — Alexander Gilman

(74) *Attorney, Agent, or Firm* — Leydig, Voit & Mayer, Ltd.

(57) ABSTRACT

The invention relates to communications technologies and discloses a rotation axis, a digital device and a Universal Serial Bus (USB) device. The rotation axis includes a sleeve, an elastic body, an indented washer, and a movable support. The sleeve includes a lip and a cylinder. The elastic body, the indented washer, and the movable support are configured sequentially around the cylinder with the lip adjacent to the elastic body along the axial direction of the cylinder beginning with the lip. A number of concave indents are configured on one end-surface of the indented washer and distributed on a circle. The end-surface of the indented washer where the concave indents are configured contacts one end-surface of the movable support. A number of protrusions are configured on the end-surface of the movable support to mate the concave indents. In the invention, a rotation axis is constituted by a few parts including a sleeve, an elastic body, an indented washer, and a movable part. Therefore, the rotation axis is characterized by simple structure, small size, low cost, and good reliability.

15 Claims, 13 Drawing Sheets

FOREIGN PATENT DOCUMENTS

| | | |
|---|---|---|
| CN | 201134604 Y | 10/2008 |
| CN | 201550379 U | 8/2010 |
| EP | 1439317 A1 | 7/2004 |
| FR | 2876195 A3 | 4/2006 |
| GB | 2412019 A | 9/2006 |
| WO | WO 2004/079935 A1 | 9/2004 |
| WO | WO 2005/124168 A1 | 12/2005 |
| WO | WO 2011/054314 A1 | 5/2011 |

OTHER PUBLICATIONS

Partial European Search Report in corresponding European Application No. 10190074.4 (Mar. 7, 2011).

International Search Report in corresponding PCT Application No. PCT/CN2010/078470 (Feb. 24, 2011).

* cited by examiner

ROTATION AXIS, DIGITAL DEVICE AND USB DEVICE

CROSS-REFERENCE TO RELATED APPLICATION

This application claims priority to Chinese Patent Application No. 200920174431.4, filed on Nov. 5, 2009, which is hereby incorporated by reference in its entirety.

FIELD OF THE INVENTION

The invention relates to communications technologies, and in particular, to a rotation axis and a digital device.

BACKGROUND OF THE INVENTION

With the continuous development of the communications technologies, the size of digital devices like Universal Serial Bus (USB) devices, data cards, and mobile phones is decreasing. As a result, the requirements for components of the digital devices are becoming more advanced.

Currently, to increase the flexibility and ease of use of the digital devices, a component known as a rotation axis is used in many digital devices. The most commonly used rotation axis is a metal rotation axis.

At least the following weaknesses exist in the conventional rotation axis described above: the structure of the existing metal rotation axis is complex; the size is large; and the cost is high.

The inventors have created the above body of information for the convenience of the reader and expressly disclaim all of the foregoing as prior art; the foregoing is a discussion of problems discovered and/or appreciated by the inventors, and is not an attempt to review or catalog the prior art.

SUMMARY OF THE INVENTION

Embodiments of the invention simplify the structure of a rotation axis and reduce the size and cost. Embodiments of the invention include a rotation axis, a digital device and a USB device. The technical solution is as follows:

A rotation axis including a sleeve, an elastic body, an indented washer and a movable support, wherein:

the sleeve includes a lip and a cylinder;

the elastic body, the indented washer, and the movable support are positioned sequentially around the cylinder with the lip adjacent to the elastic body along the axial direction of the cylinder beginning with the lip;

the surface of the indented washer that contacts the surface of the movable support is configured with a first number of concave indents, wherein the concave indents are distributed in a circle; and the surface of the movable support contacting the indented washer is configured with a second number of protrusions, wherein the protrusions correspond to the concave indents on the surface of the indented washer.

A digital device including the rotation axis.

A Universal Serial Bus (USB) device including a USB plug, a rotating structure, and a device body, wherein:

the USB plug is fixedly connected to the rotating structure; the rotating structure includes a rotating unit; the rotating structure and the device body are connected via the rotating unit; and the rotating structure rotates on a side of the device body through the rotating unit.

The technical solution provides the following benefit:

A rotation axis is comprised of a few parts including a sleeve, an elastic body, an indented washer, and a movable part. Therefore, the rotation axis is characterized by simple structure, small size, low cost, and good reliability.

Other objects and advantages of the invention will become apparent upon reading the following detailed description and upon reference to the drawings.

DETAILED DESCRIPTION OF THE EMBODIMENTS

To better explain the purpose, technical solution, and benefits of the invention, the embodiments of the invention will be described in detail with reference to the accompanying drawings.

First Embodiment

Figure 1:
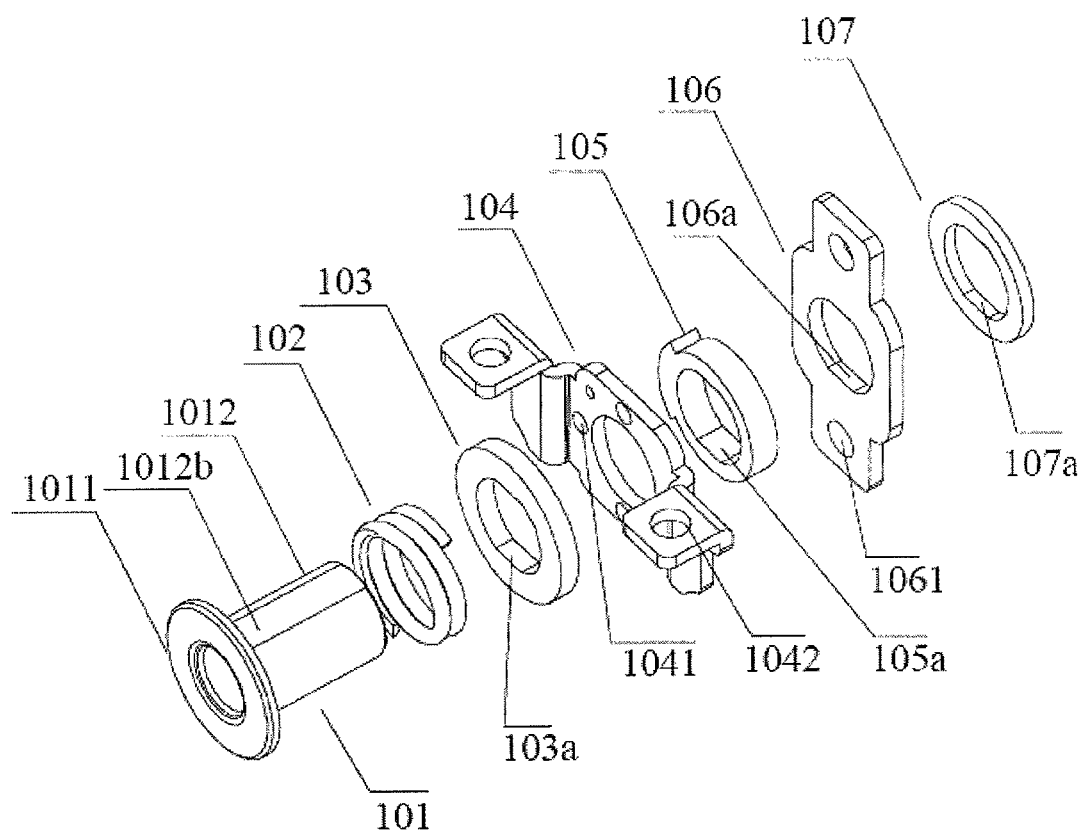
FIG. 1 is a schematic drawing illustrating positions of parts of a rotation axis provided according to a first embodiment of the invention.
Figure 2:
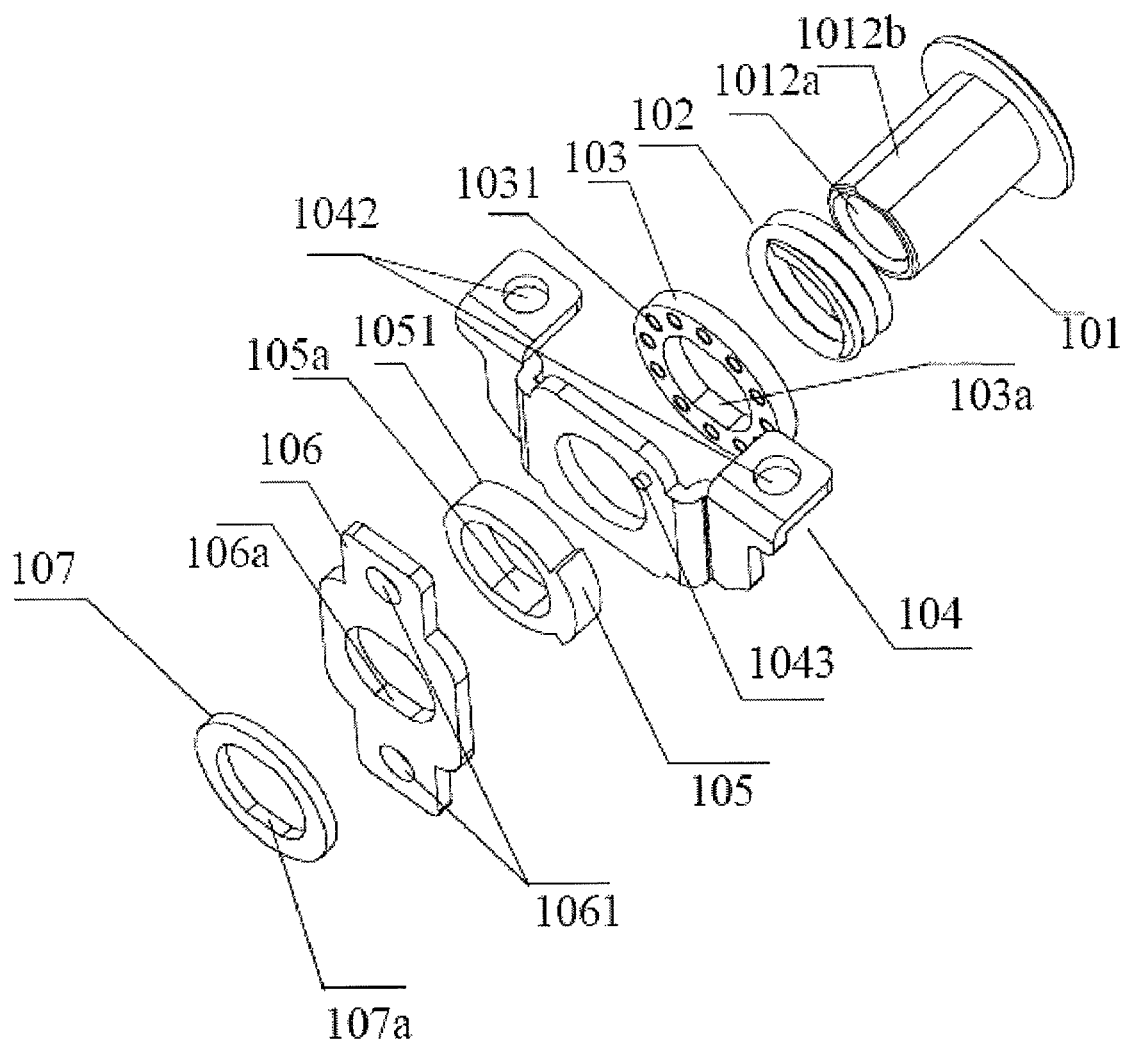
FIG. 2 is another schematic drawing illustrating positions of parts of the rotation axis provided according to the first embodiment of the invention.

FIG. 1 and FIG. 2 illustrate a rotation axis provided according to the first embodiment of the invention. The rotation axis includes a sleeve 101, an elastic body 102, an indented washer 103, and a movable support 104.

The sleeve 101 includes a lip 1011 and a cylinder 1012.

The elastic body 102, indented washer 103, and movable support 104 are positioned sequentially around the cylinder with the lip adjacent to the elastic body along the axial direction of the cylinder 1012 beginning with the lip 1011.

A number of concave indents 1031 are depressed on one end-surface of the indented washer 103 and distributed in a circle. The end-surface of the indented washer 103 where concave indents 1031 are deposited contacts one end-surface of the movable support 104. This end-surface of the movable support 104 is configured with a number of protrusions 1041 which correspond to the concave indents 1031.

Further, the rotation axis includes a stop ring 105. The stop ring 105 is positioned around the cylinder 1012 and located behind the movable support 104 along the axial direction. A stop groove 1051 is present on the stop ring 105.

Accordingly, one end-surface of the movable support 104 is configured with a positioning rod 1043. The end-surface of the movable support 104 with the positioning rod 1043 contacts the stop ring 105.

Further, the rotation axis includes a positioning support 106 which is positioned around the cylinder 1012 and located behind the stop ring 105 along the axial direction.

Further, the positioning support 106 is configured with at least one positioning hole 1061.

Further, the rotation axis includes a locking washer 107 which is positioned around the cylinder 1012 and located behind the positioning support 106 along the axial direction.

Further, the elastic body 102, indented washer 103, and movable support 104 are configured to have a clearance fit in relation to the cylinder 1012.

The stop ring 105, positioning support 106, and locking washer 107 are configured to have an interference fit with the cylinder 1012.

Further, the outer surface of the cylinder 1012 includes several positioning surfaces 1012b.

Accordingly, corresponding positioning surfaces are configured respectively on the inner surfaces of the indented washer 103, stop ring 105, positioning support 106, and locking washer 107 that contact the several positioning surfaces 1012b of the cylinder 1012. These positioning surfaces are referred to as positioning surfaces 103a, positioning surfaces 105a, and positioning surfaces 107a.

Further, the elastic body 102 is initially compressed.

Further, the middle of the cylinder 1012 is configured with a through-hole 1012a.

Further, the positioning support 104 is configured with at least one positioning hole 1042.

The rotation axis provided according to the embodiment of the invention is applicable to digital devices such as USB devices, data cards, and mobile phones.

The rotation axis provided according to the embodiment of the invention is implemented with parts including the sleeve, elastic body, indented washer, and movable support. It is characterized by simple structure, small size, low cost, and good reliability. The interaction between the concave indents, the protrusions, and the elastic body produces a tactile feeling so as to realize the angle of each rotation of the rotation axis. In addition, any rotation angle range can be realized for the rotation axis by setting the angle of the stop groove on the stop ring. Further, by adjusting the length and elasticity coefficient of the elastic body or adjusting the depth of engagement between the concave indents and protrusions, the required maximum torque can be obtained.

Second Embodiment

Figure 3:
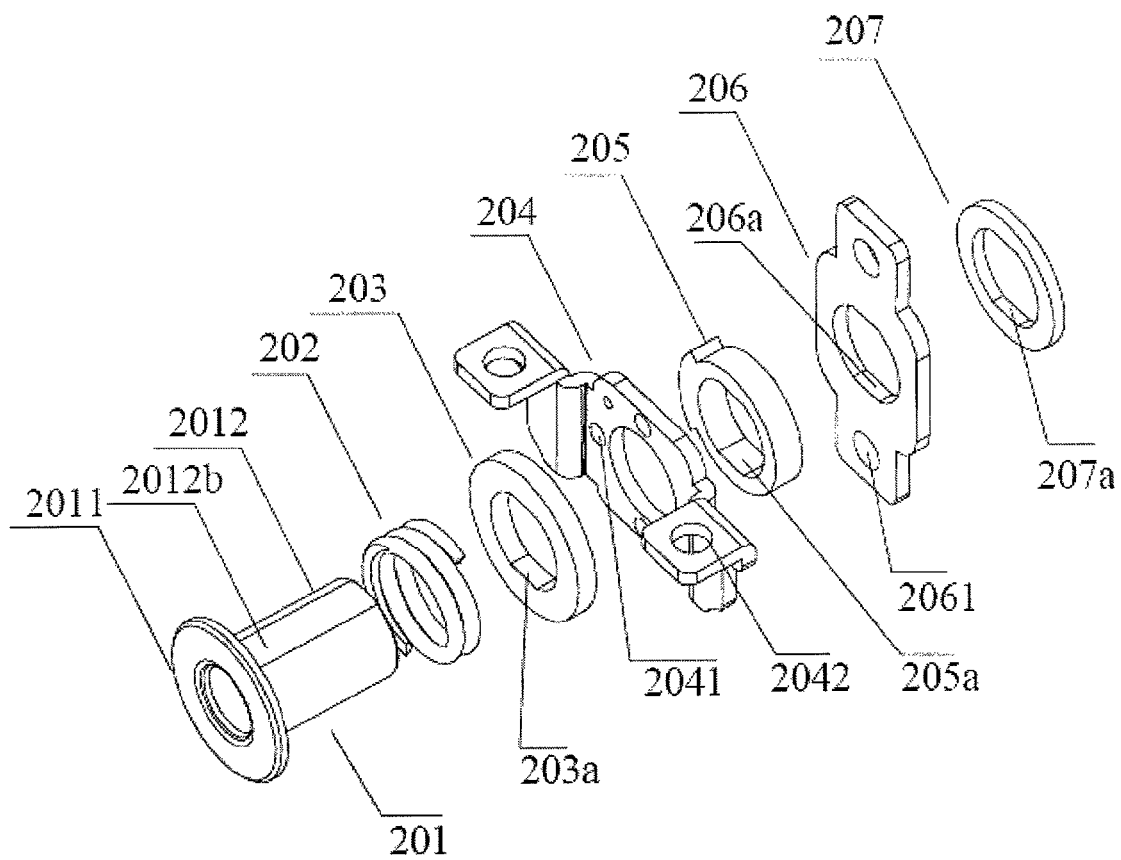
FIG. 3 is a schematic drawing illustrating positions of parts of a rotation axis provided according to a second embodiment of the invention.
Figure 4:
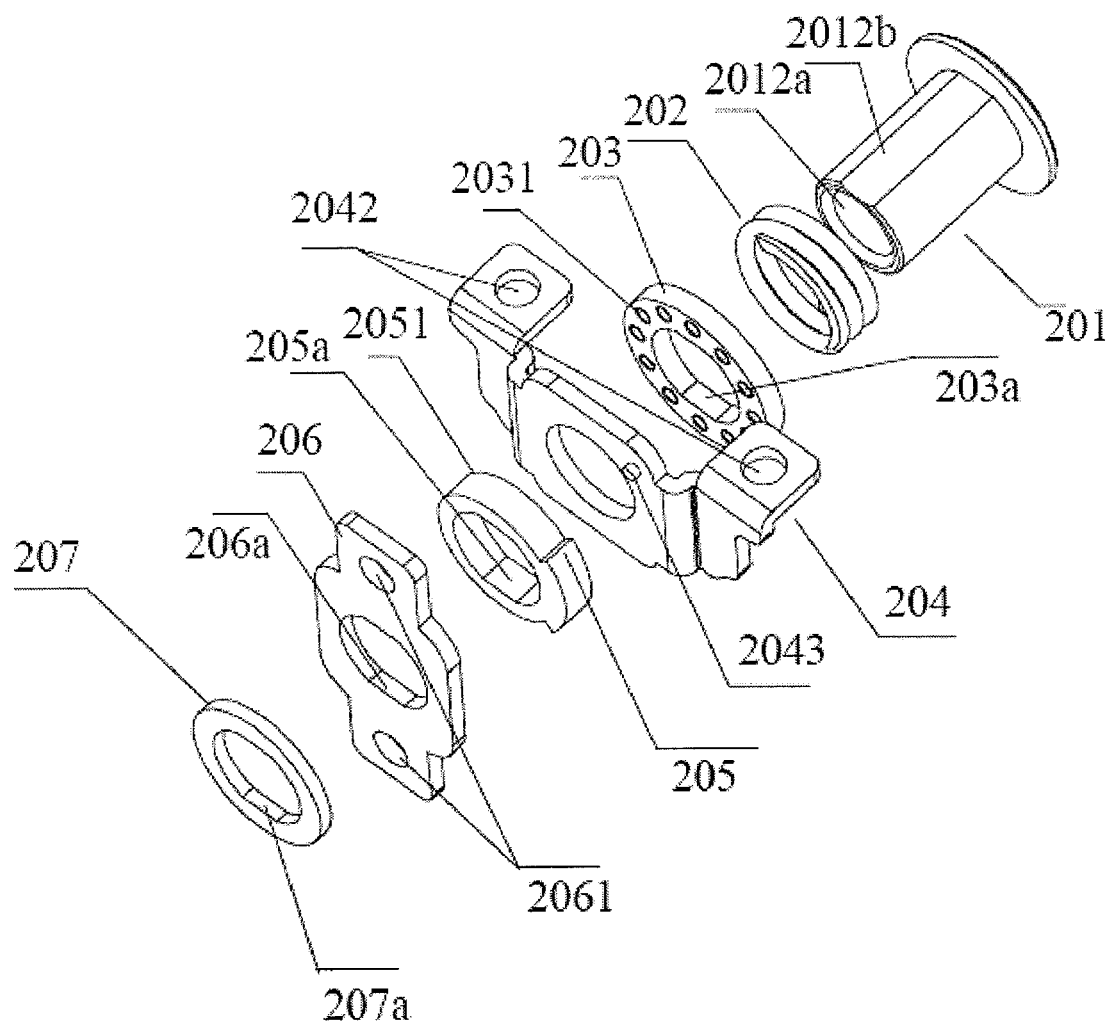
FIG. 4 is another schematic drawing illustrating positions of parts of the rotation axis provided according to the second embodiment of the invention.
Figure 5:
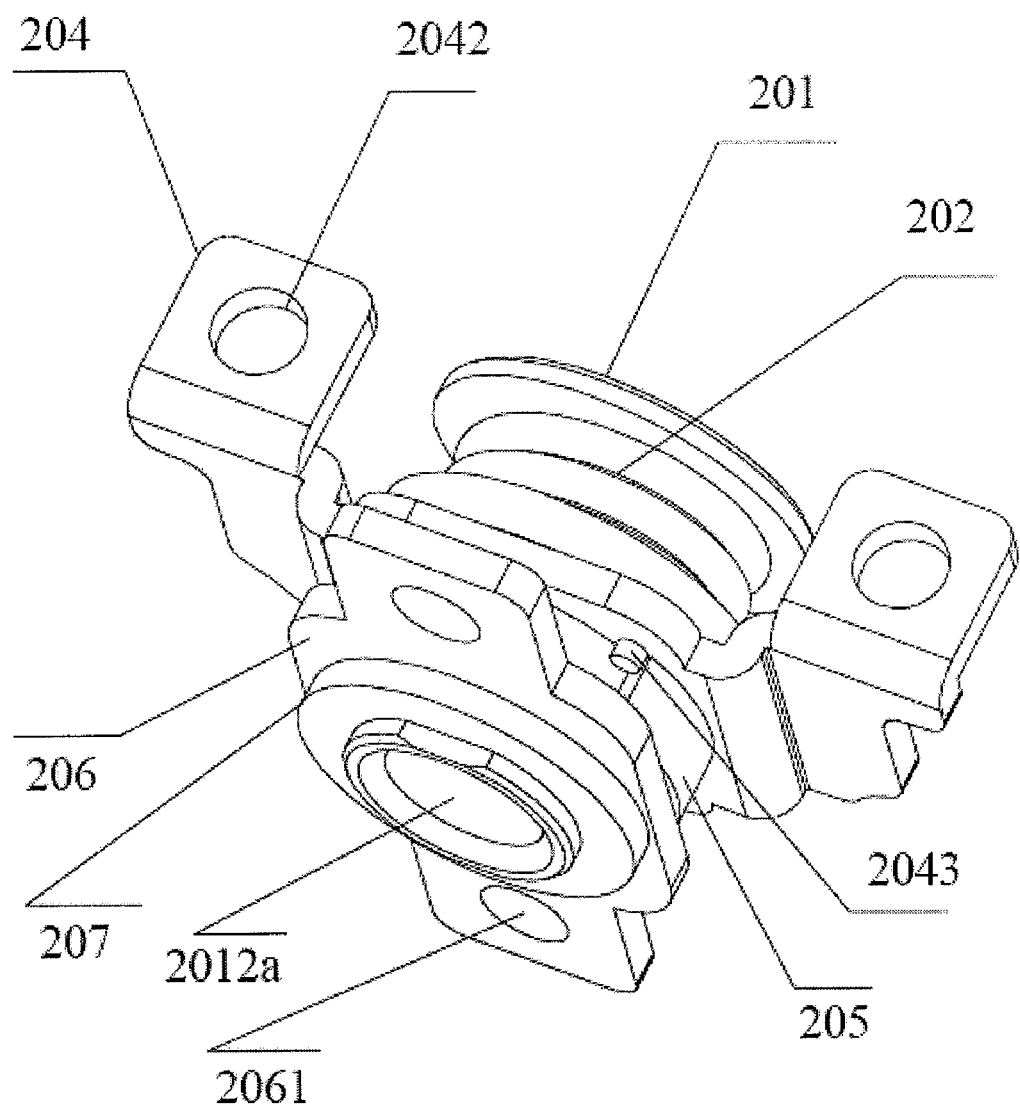
FIG. 5 illustrates an overall structure of the rotation axis provided according to the second embodiment of the invention.
Figure 6:
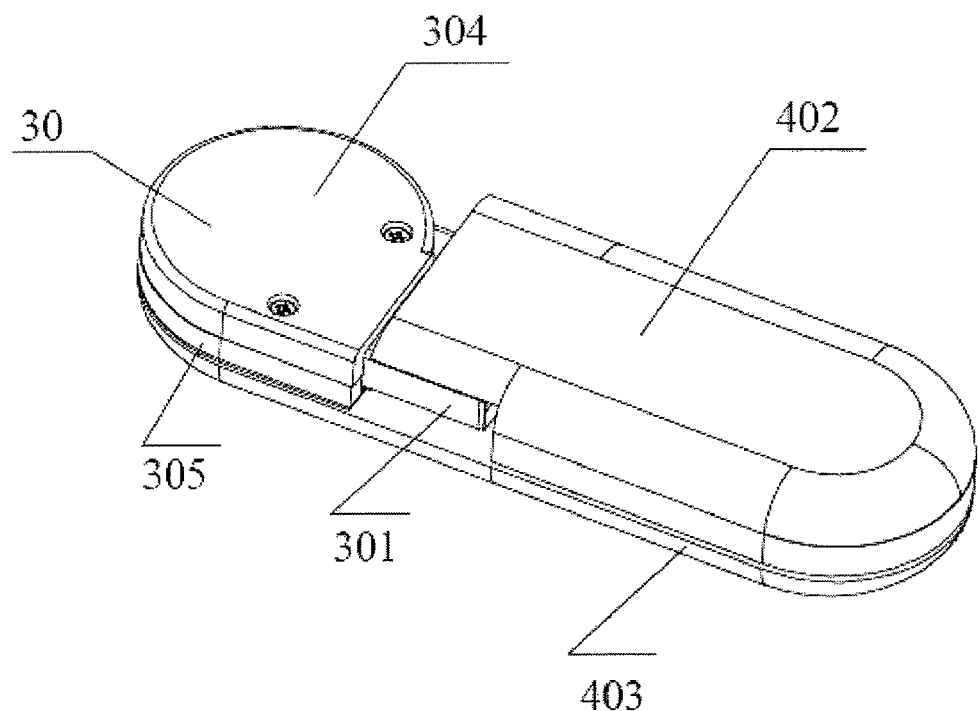
FIG. 6 illustrates an overall structure of a data card provided according to a third embodiment of the invention.
Figure 7:
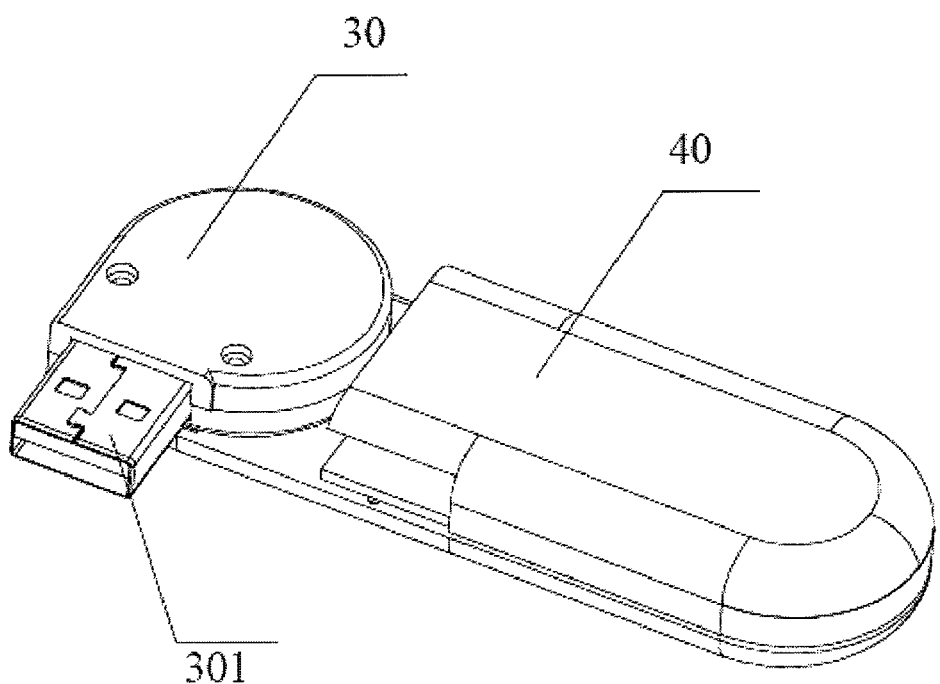
FIG. 7 illustrates a structure of the data card provided according to the third embodiment of the invention where the rotating USB head of the data card is rotated by 90 degrees.
Figure 8:
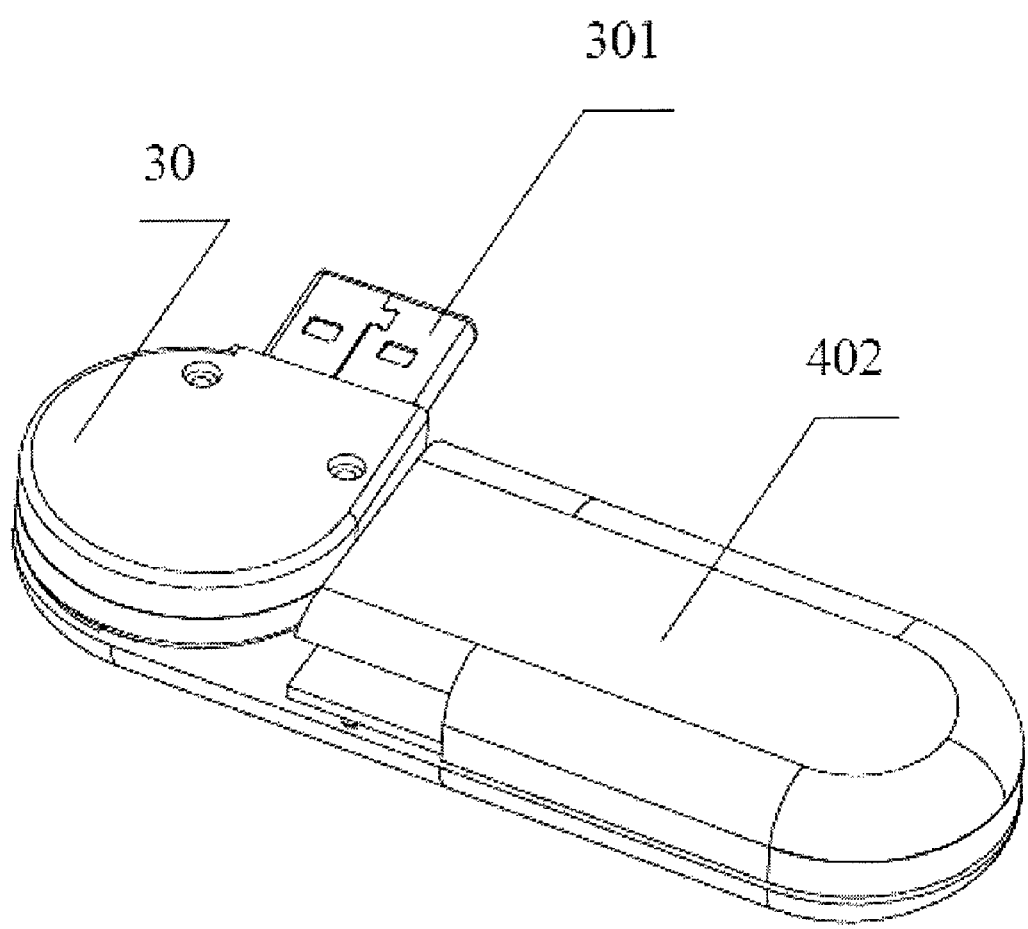
FIG. 8 illustrates a structure of the data card provided according to the third embodiment of the invention where the rotating USB head of the data card is rotated by 270 degrees.
Figure 9:
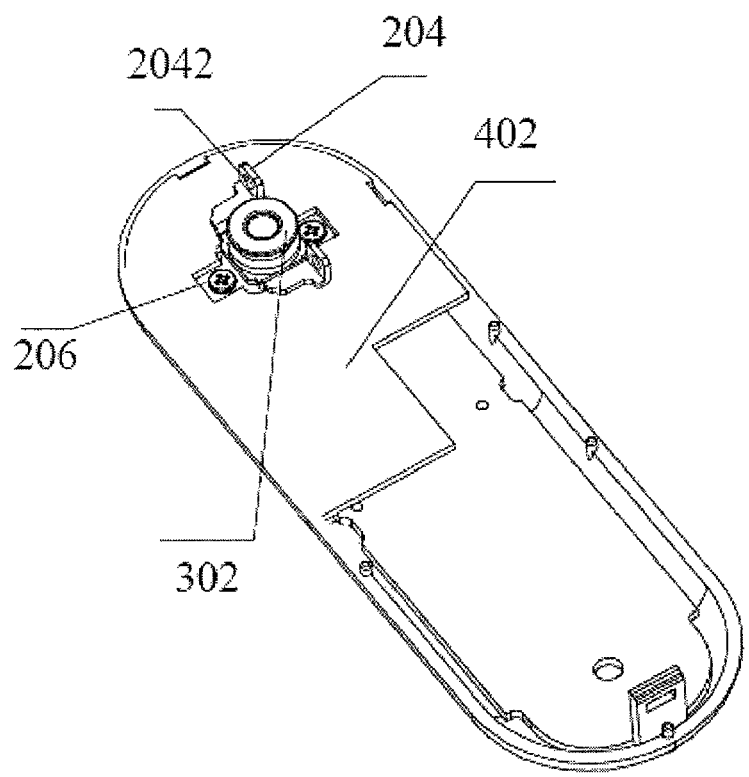
FIG. 9 illustrates an inner structure of the data card provided according to the third embodiment of the invention.
Figure 10:
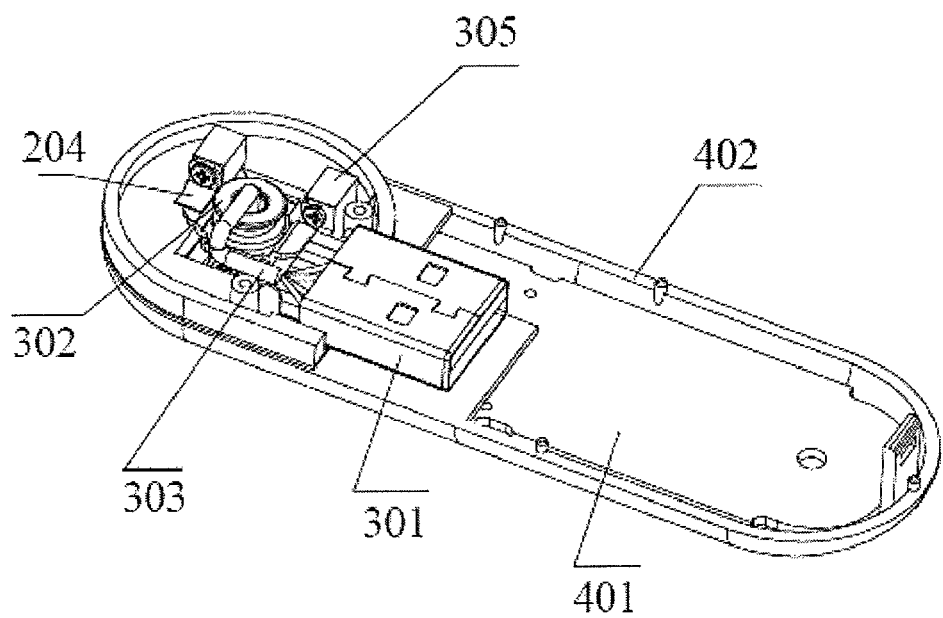
FIG. 10 illustrates another inner structure of the data card provided according to the third embodiment of the invention.
Figure 11:
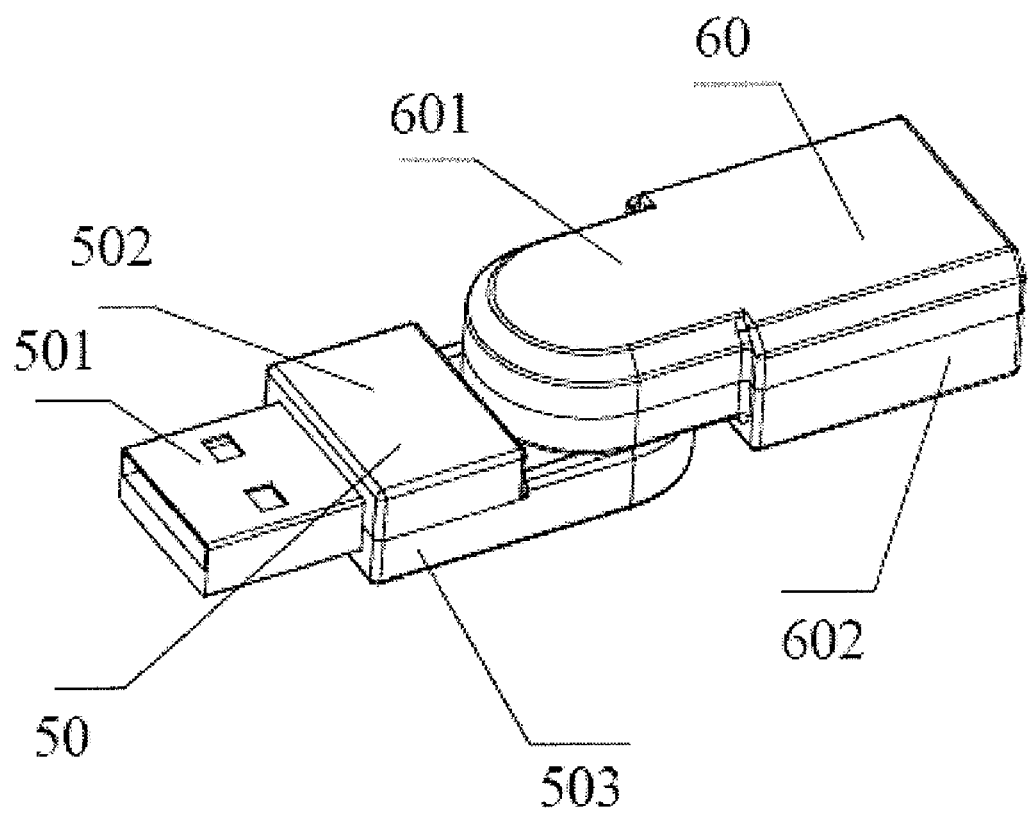
FIG. 11 illustrates an overall structure of a USB connector adapter provided according to a fourth embodiment of the invention.
Figure 12:
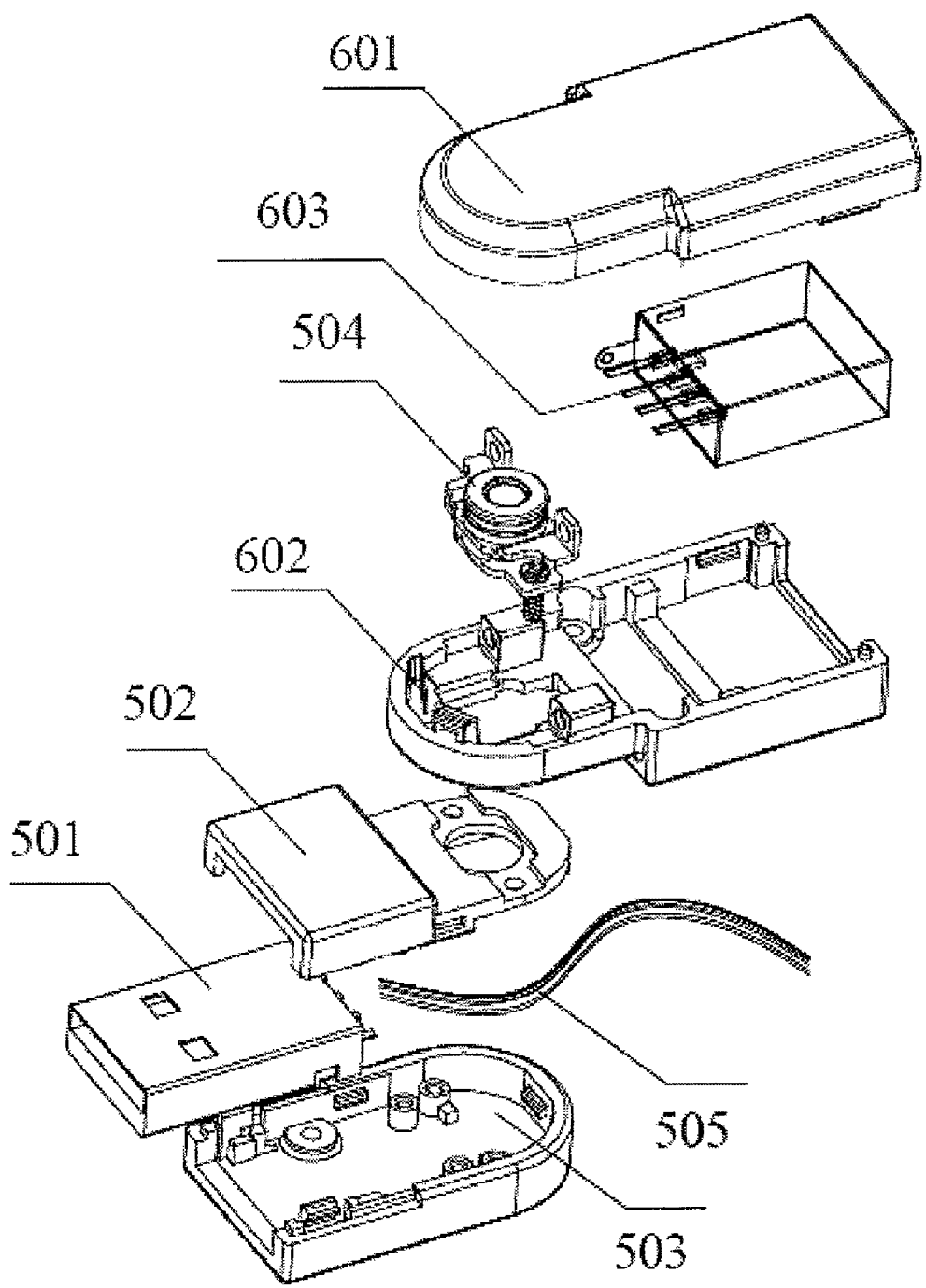
FIG. 12 illustrates an inner structure of the USB connector adapter provided according to the fourth embodiment of the invention.
Figure 13:
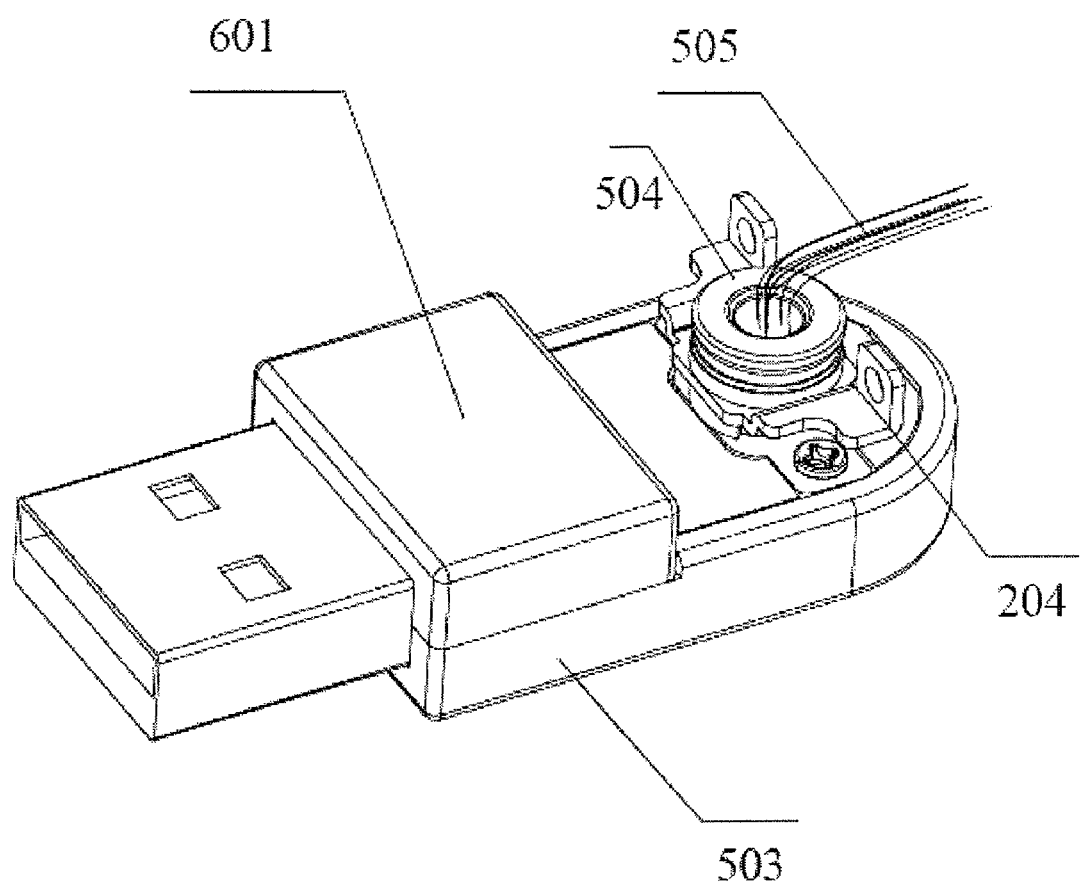
FIG. 13 illustrates a structure of an adapter head USB A-part of the USB connector adapter provided according to the fourth embodiment of the invention.
Figure 14:
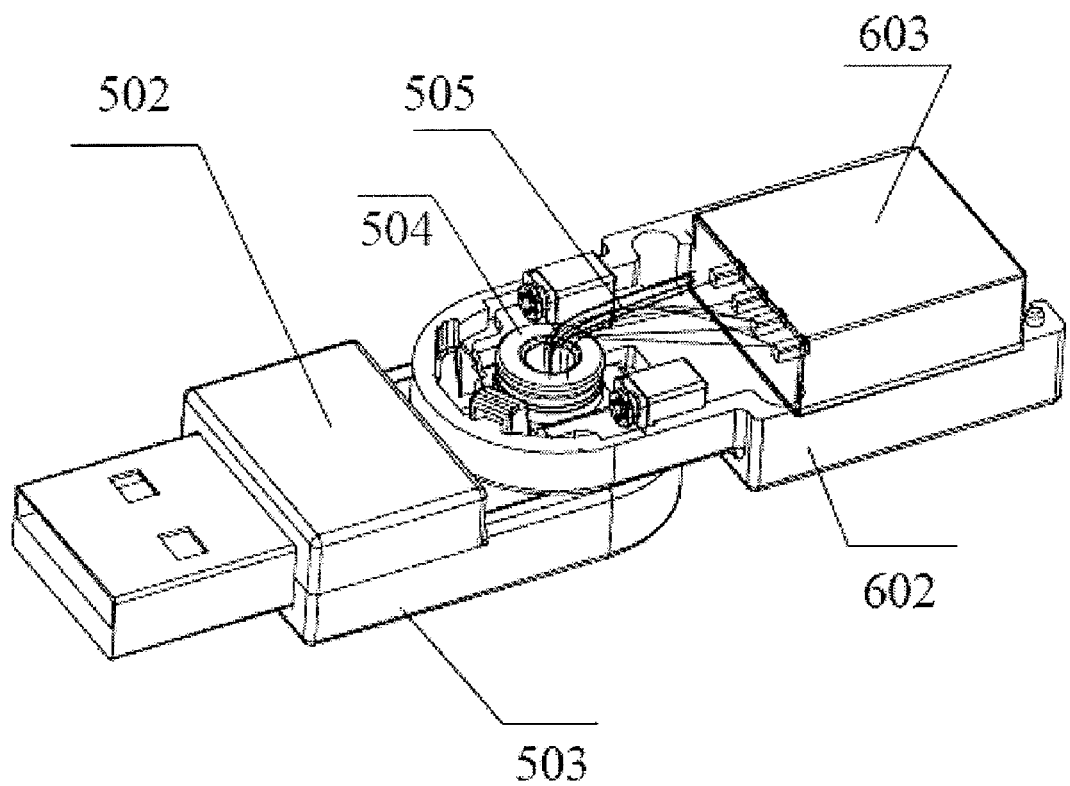
FIG. 14 illustrates a structure of an adapter head USB B-part of the USB connector adapter provided according to the fourth embodiment of the invention.
Figure 15:
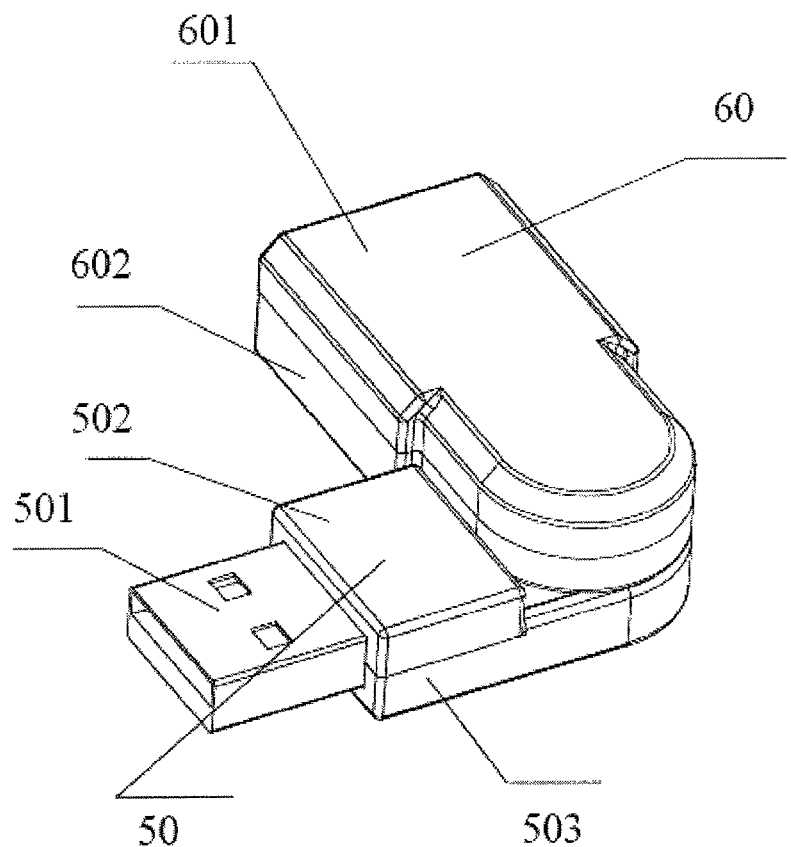
FIG. 15 illustrates a structure of the USB connector adapter provided according to the fourth embodiment of the invention where the adapter head USB A-part is rotated by 90 degrees.

FIG. 3, FIG. 4, and FIG. 5 illustrate a rotation axis provided according to a second embodiment of the invention. The rotation axis includes a sleeve 201, an elastic body 202, an indented washer 203, a movable support 204, a stop ring 205, a positioning support 206, and a locking washer 207.

The sleeve 201 includes a lip 2011 and a cylinder 2012. The middle of the cylinder 2012 may be configured with a through-hole 2012a. For embodiments utilizing wiring, wires can be conveniently led through the through-hole 2012a.

Note the shape of the through-hole 2012a may be round, square, or rhombic. In one embodiment of the invention, the through-hole 2012a takes on a round shape. In other embodiments of the invention, the through-hole 2012a may take on other shapes. The shape of the through-hole 2012a is not limited to any one embodiment of the invention.

The elastic body 202, indented washer 203, movable support 204, stop ring 205, positioning support 206 and locking washer 207 are positioned sequentially around the cylinder 2012 of the sleeve 201 from the lip 2011 along the axial direction of the cylinder 2012 beginning with the lip 2011.

An appropriate method may be adopted to configure the elastic body 202, indented washer 203, movable support 204, stop ring 205, positioning support 206 and locking washer 207 around the cylinder 2012 of the sleeve 201 so as to meet certain conditions. In particular, when the elastic body 202 and indented washer 203 are configured around the cylinder 2012 of the sleeve 201, the configuration method may enable the elastic body 202 and indented washer 203 to move along the axial direction of the cylinder 2012 but not around the cylinder 2012; when the movable support 204 is configured around the cylinder 2012 of the sleeve 201, the configuration method may enable the movable support 204 to move around the cylinder 2012 but not along the axial direction of the cylinder 2012; when the stop ring 205, positioning supporting 206, and locking washer 207 are configured around the cylinder 2012 of the sleeve 201, the configuration method may enable the stop ring 205, positioning supporting 206, and locking washer 207 to move neither around the cylinder 2012 nor along the axial direction of the cylinder 2012.

In the embodiment of the invention, the configuration of the parts is as follows: the indented washer 203 is positioned around the cylinder 2012 of the sleeve 201 with a clearance fit, the outer surface of the cylinder 2012 of the sleeve 201 is configured with two positioning surfaces 2012b (longitudinally symmetric in the embodiment of the invention), and the two inner surfaces of the indented washer 203 that contact the two positioning surfaces 2012b of the cylinder 2012 are configured with two positioning surfaces 203a, so that the indented washer can move to and fro along the axial direction of the cylinder 2012 but not rotate around the cylinder 2012. The elastic body 202 is configured around the cylinder 2012 with a clearance fit, with one end of the elastic body 202 fixed to the lip 2011 of the sleeve 201 and the other end of the elastic body 202 fixed to the indented washer 203, so that the elastic body 202 can move to and fro along the axial direction of the cylinder 2012 together with the indented washer 203 but not rotate around the cylinder 2012. The movable support 204 is configured around the cylinder 2012 of the sleeve 201 with a clearance fit so that the movable support 204 can rotate around the cylinder 2012 but not move along the axial direction of the cylinder 2012. The stop ring 205, positioning support 206 and locking washer 207 are fixed to the cylinder 2012 of the sleeve 201 with interference fits and positioning surfaces (positioning surfaces 205a, positioning surfaces 206a, and positioning surfaces 207a) are configured on the two inner surfaces of the stop ring 205, positioning support 206 and locking washer 207 that contact the two positioning surfaces 2012b of the cylinder 2012, so that the stop ring 205, positioning support 206 and locking washer 207 can be relatively still to the sleeve 201, that is, the stop ring 205, positioning support 206 and locking washer 207 will not rotate around the cylinder 2012 or move along the axial direction of the cylinder 2012.

Note the elastic body 202, indented washer 203, movable support 204, stop ring 205, positioning support 206 and locking washer 207 may be configured around the cylinder 2012 of the sleeve 201 in other methods to meet the above conditions. For example, one positioning surface is configured on each part, or three or four or other numbers of positioning surfaces are configured on each part; or the stop ring 205, positioning support 206 and locking washer 207 are welded fixedly to the cylinder 2012. The configuration of the parts is not limited to the method provided in the embodiment of the invention. The configuration can be flexible according to practical conditions.

The elastic body 202 is initially compressed to provide a certain pressing force.

Specifically, the initial state is the state where the elastic body 202 is originally assembled to the rotation axis. The elastic body 202 may be a spring or other structure that provide an elastic force.

The end-surface of the indented washer 203 that contacts the movable support 204 are configured with a number of concave indents 2031.

The concave indents 2031 on the indented washer 203 may be distributed in a circle. The concave indents 2031 may be distributed evenly or not evenly in a circle of a certain diameter. The diameter depends on the size and the practical application of the indented washer 203. The diameter is not limited here. The indented washer 203 may be a thin slice in a round, square, or rhombic shape with a round hole in the center. The diameter of the round hole is slightly larger than that of the cylinder 2012, so that the indented washer 203 can be configured around the cylinder 2012 and move to and fro along the axial direction of the cylinder 2012 but not rotate around the cylinder 2012. In the embodiment of the invention, the indented washer 203 is preferably a round slice with a round hole in the center.

Accordingly, the end-surface of the movable support 204 that contacts the indented washer is configured with a number of protrusions 2041 corresponding to the concave indents 2031.

Particularly, when the movable support 204 is rotated around the cylinder 1012, the protrusions 2041 can be rotated into or out of the concave indents 2031. Through the interaction of the protrusions 2041, concave indents 2031, and elastic force of the elastic body 202, the elastic body 202 and indented washer 203 can move to and fro along the axial direction of the cylinder 2012. The number and distribution of the protrusions 2041 may depend on the number and distribution of the concave indents 2031. Generally, the number of protrusions 2041 is smaller than or equal to the number of concave indents 2031. For example, if 12 concave indents 2031 are distributed evenly on a circle of a certain diameter with an angle of 30 degrees between each two adjacent concave indents 2031, 12 protrusions 2041 can be designed accordingly with an angle of 30 degrees between each two adjacent protrusions 2041, or 4 protrusions 2041 can be designed with an angle of 90 degrees between each two adjacent protrusions 2041. If the concave indents 2031 on the indented washer 203 are not evenly distributed on a circle of a certain diameter, the number of protrusions 2041 may be 1.

In the embodiment of the invention, the protrusions 2041 are rotated into the concave indents 2031 initially; when the protrusions 2041 on the movable support 204 are rotated relatively to the concave indents 2031 on the indented washer 203, with the interaction of the elastic force provided by the elastic body 202, the protrusions 2041 are rotated into the concave indents 2031 and rotated out of the concave indents 2031 constantly. That is, the protrusions 2041 and the concave indents 2031 are constantly interlocked and separated and such changes produce a tactile feeling. The angle of each move of the movable support 204 relative to the indented washer 203 (the process where protrusions 2041 are moved out of the concave indents 2031 and moved into the concave indents 2031 again) can be adjusted by changing the number and positions of the concave indents 2031 on a circle of a certain diameter. For example, if the angle between each two adjacent concave indents 2031 is 30 degrees, the angle of each move of the movable support 204 relative to the indented washer 203 is 30 degrees. The angle of each move of the movable support 204 relative to the indented washer 203 may be described as a working range angle. Changing the number and distribution of the concave indents 2031 on the indented washer 203 can adjust the working range angle of the rotation axis. In addition, the torque that enables the protrusions 2041 of the movable support 204 to move completely out of the concave indents 2031 of the indented washer 203 is the maximum torque of the rotation axis. The maximum torque can be controlled by changing the elasticity coefficient of the elastic body 202 and the size of the protrusions 2041 and concave indents 2031. To help the protrusions 2041 to move into and move out of the concave indents 2031, the depth of the concave indents 2031 is generally not large and the diameter of the protrusions 2041 is larger than the depth of concave indents 2031.

The movable support 204 may be a thin slice in a round, square, or rhombic shape with a round hole in the center and the diameter of the round hole is larger than the diameter of the cylinder 2012 so that the movable support 204 can be positioned around the cylinder 2012 and can rotate around the cylinder 2012. In this embodiment of the invention, the movable support 204 is a round slice with a round hole in the center. In addition, when the rotation axis provided according to this embodiment of the invention is applied to other devices, to help the connection with the other devices, the movable support 204 may be configured with at least one positioning hole 2042. As shown in FIG. 3 and FIG. 4, a pair of positioning holes 2042 are configured on two sides of the movable support 204.

A stop groove 2051 is configured on the stop ring 205 and a positioning rod 2042 is configured on the end-surface of the movable support 204 that contacts the stop ring 205.

When the positioning rod 2042 on the movable support 204 contacts the edge of the stop groove 2051 on the stop ring 205, the movable support 204 cannot move in the previous moving direction. Thereby, the stop groove 2051 on the stop ring 205 will limit the move of the positioning rod 2042 on the movable support 204 to a certain angle range. That is, the angle of the stop groove 2051 on the stop ring 205 decides the rotation angle range of the movable support 204. For example, if the angle of the stop groove 2051 on the stop ring 205 is 270 degrees, the rotation angle range of the movable support 204 is from 0 to 270 degrees.

Note, the invention can be implemented without a stop ring 205 but, in this case, the movable support 204 can rotate by any angle clockwise or counterclockwise. When a through-hole 2012a is configured in the middle of the cylinder 2012 and wires are led through the through-hole 2012a, the wires will be hinged.

At least one positioning hole 2061 is configured on the positioning support 206. When the rotation axis is applied in another device, the positioning hole 2061 of the positioning support 206 can fasten the entire rotation axis to the other device.

Note the fastening of the rotation axis is not limited to the configuration of the positioning hole 2061 but may be implemented in other methods such as a conventional rotation axis, for example, by the use of a positioning bolt or interference fit. The design can be flexible according to the practical conditions. In addition, the invention can still be implemented without a positioning support 206. In this case, when the rotation axis is applied in another device, the rotation axis is fastened through other parts in the axis, for example, a positioning hole configured on the lip 2011 of the sleeve 201.

The locking washer 207 can compress and configure the elastic body 202, indented washer 203, movable support 204, stop ring 205, and positioning support 206 around the cylinder 2012 of the sleeve 201 and force the elastic body 202 to be compressed in the initial state to provide an initial pressing force.

Note, the invention can still be implemented with no locking washer 207. For example, the elastic body 202, indented washer 203, movable support 204, stop ring 205, and positioning support 206 can be compressed around the cylinder 2012 of the sleeve 201 and the end of the cylinder 2012 is turned outward and fixed to the positioning support 206; or, after the elastic body 202, indented washer 203, movable support 204, stop ring 205, and positioning support 206 are compressed around the cylinder 2012 of the sleeve 201, the stop ring 205 and positioning support 206 are welded to the cylinder 2012.

The working principle of the rotation axis provided according to the embodiment of the invention is as follows:

In the initial state, the protrusions 2041 on the movable support 204 are rotated in the concave indents 2031 on the indented washer 203 and the elastic body 202 is compressed to provide an initial pressing force. When the movable support 204 is rotated, the protrusions 2041 on the movable support 204 are rotated out of the concave indents 2031 on the indented washer. In this case, the indented washer 203 is pressed by the protrusions 2041 on the movable support 204 and moves toward the elastic body 202 to compress the elastic body 202. The elastic body 202 is compressed by a larger force and the elastic force is greater. When the movable support 204 is rotated again, the protrusions 2041 on the movable support 204 are moved into the next concave indents 2031 and the indented washer 203 moves away from the elastic body 202 under the elastic force of the elastic body 202. Thus, the elastic body 202 is less compressed and the elastic force is weaker. During the rotation of the movable support 204, as a protrusion 2041 is moved out of a concave indent 2031 and moved into the next concave indent 2031, the indented washer 203 moves to and fro along the axial direction of the cylinder 2012 and the compression of the elastic body 202 is larger and smaller accordingly. Such changes produce a tactile feeling. When the movable support 204 is rotated so that the positioning rod 2042 contacts the edge of the stop groove 2051 of the stop ring 205, the rotation of the movable support 204 is stopped and the maximum rotation angle is reached.

The material of the rotation axis is not limited and the material may be metal or plastic. The rotation axis may be made through metal stamping or powder metallurgy. The rotation axis is applicable to digital products such as USB flash disks, data cards, and mobile phones.

The rotation axis provided according to the embodiment of the invention is implemented with the parts including the sleeve, elastic body, indented washer, and movable support. It is characterized by simple structure, small size, low cost, and good reliability. The interaction between the concave indents, the protrusions, and the elastic body produces a tactile feeling so as to realize the angle of each rotation of the rotation axis. In addition, any rotation angle range can be realized for the rotation axis by setting the angle of the stop groove on the stop ring. Further, by adjusting the length and elasticity coefficient of the elastic body or adjusting the depth of engagement between the concave indents and protrusions, the required maximum torque can be obtained.

The invention will be described further with an exemplary embodiment where the rotation axis is applied in a data card.

Third Embodiment

FIG. 6 to FIG. 10 illustrate a data card provided according to a third embodiment of the invention. The data card includes a data card rotating USB head 30 and a data card body 40.

The rotating USB head 30 includes a USB connector 301, a rotation axis 302, a connecting wire 303, a USB upper support 304, and a USB lower support 305. The rotation axis 302 includes a sleeve 201, an elastic body 202, an indented washer 203, a movable support 204, a stop ring 205, a positioning support 206, and a locking washer 207. The structures and functions of the parts of the rotation axis 302 are the same as those in the second embodiment and will not be repeated here. The data card body 40 includes a Printed Circuit Board (PCB) 401, a data card upper shell 402, and a data card lower shell 403.

The positioning support 206 of the rotation axis 302 is fixed to the data card upper shell 402 so that the positioning support 206 is fastened to the data card body 40.

Particularly, fixing the positioning support 206 to the data card upper shell 402 may include: welding the positioning support 206 to the data card upper shell 402; or designing two positioning holes 2061 on the positioning support 206 and fixing the positioning support 206 to the data card upper shell 402 with two screws; or fixing the positioning support 206 to the data card upper shell 402 by various methods provided in a conventional rotation axis. The method is not limited. If the rotation axis 302 does not have a positioning support 206, the lip 2011 of the sleeve 201 may be fixed to the data card upper shell 402 using a similar method.

The movable support 204 of the rotation axis 302 is fixed to the USB lower support 305 so that the movable support 204 is fixed to the rotating USB head 30.

Particularly, a method similar to fixing the positioning support 206 to the data card upper shell 402 may be adopted to fix the movable support 204 to the USB lower support 305. The method will not be detailed here.

The USB connector 301 is connected to one end of the connecting wire 303. The other end of the connecting wire 303 is led through the through-hole 2012a in the cylinder 2012 and connected to the PCB 401.

Particularly, the connecting wire 303 may be connected to the USB connector 301 and the PCB 401 through welding or clamping. The connection mode is not limited.

The conduction between the USB connector 301 and the rotation axis 302 is implemented through a conductor and the conduction between the rotation axis 302 and the PCB 401 is achieved through another conductor.

Particularly, a conductor such as a metal spring may be used to implement conduction between the rotation axis 302 and the USB connector 301 and between the rotation axis 302 and the PCB 401 so that the rotation axis 302 is grounded.

The USB connector 301 is located between the USB upper support 304 and the USB lower support 305. The USB upper support 304 and the USB lower support 305 are fastened together to protect and fix the USB connector 301.

The working principle of the data card provided according to the embodiment of the invention is as follows: when the rotating USB head 30 is rotated, the movable support 204 of the rotation axis 302 rotates relatively to the indented washer 203 so that the rotating USB head 30 rotates relatively to the data card body 40. With the tactile feeling, working range angle and maximum rotation angle provided by the rotation axis 302, the rotating USB head 30 rotates relatively to the data card body 40.

With a rotation axis that includes such parts as the sleeve, elastic body, indented washer, and movable support, the data card provided according to the embodiment of the invention can rotate by any angle and be characterized by simple structure, small size, low cost, and good reliability.

The invention will be described further with an exemplary embodiment where the rotation axis is applied in a USB connector adapter.

Fourth Embodiment

FIG. 11 to FIG. 15 illustrate a USB connector adapter provided according the fourth embodiment of the invention. The USB connector adapter includes an adapter head USB A-part 50 and an adapter head USB B-part 60.

The adapter head USB A-part 50 includes a USB A connector 501, a USB A upper support 502, a USB A lower support 503, a rotation axis 504, and a connecting wire 505. The rotation axis 504 includes a sleeve 201, an elastic body 202, an indented washer 203, a movable support 204, a stop ring 205, a positioning support 206, and a locking washer 207. The structures and functions of the parts of the rotation axis 504 are the same as those in the second embodiment and will not be repeated here. The adapter head USB B-part 60 includes a USB B upper support 601, a USB B lower support 602 and a USB B connector 603.

The positioning support 206 of the rotation axis 504 is fixed to the USB A lower support 503 so that the positioning support 206 is fixed to the adapter head USB A-part 50.

Particularly, a method similar to fixing the positioning support 206 to the data card upper shell 402 in the third embodiment may be adopted to fix the positioning support 206 to the USB A lower support 503.

The movable support 204 of the rotation axis 504 is fixed to the USB B lower support 602 so that the movable support 204 is fixed to the adapter head USB B-part 60.

Particularly, a method similar to fixing the movable support 204 to the USB lower support 305 in the third embodiment may be adopted to fix the movable support 204 to the USB B lower support 602.

The USB A connector 501 is connected to one end of the connecting wire 505. The other end of the connecting wire 505 is led through the through-hole 2012a in the cylinder 2012 and connected to the USB B connector 603.

Particularly, the connecting wire 505 may be connected to the USB A connector 501 and the USB B connector 603 through welding or clamping. The connection mode is not limited.

The USB A connector 501 is located between the USB A upper support 502 and the USB A lower support 503. The USB A upper support 502 and the USB A lower support 503 are fastened together to protect and fix the USB A connector 501.

The USB B connector 603 is located between the USB B upper support 601 and the USB B lower support 602. The USB B upper support 601 and the USB B lower support 602 are fastened together to protect and fix the USB B connector 603.

The working principle of the USB connector adapter provided according to the embodiment of the invention is as follows: when the adapter head USB B-part 60 is rotated, the movable support 204 of the rotation axis 504 rotates relative to the indented washer 203 so that the adapter head USB B-part 60 rotates relative to the adapter head USB A-part 50. With the tactile feeling, working range angle and maximum rotation angle provided by the rotation axis 504, the adapter head USB B-part 60 rotates relative to the adapter head USB A-part 50.

With a rotation axis that includes such parts as the sleeve, elastic body, indented washer, and movable support, the USB connector adapter provided according to the embodiment of the invention can rotate by any angle and be characterized by simple structure, small size, low cost, and good reliability.

Fifth Embodiment

Figure 16:
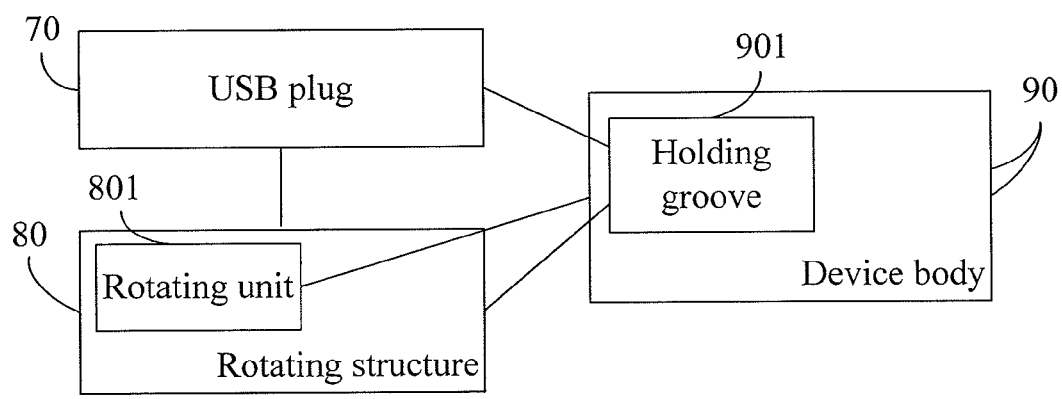
FIG. 16 illustrates a structure of a USB device provided according to a fifth embodiment of the invention.

FIG. 16 illustrates a USB device provided according to the fifth embodiment of the invention. The USB device includes a USB plug 70, a rotating structure 80, and a device body 90.

The USB plug 70 is fixedly connected to the rotating structure 80. The rotating structure 80 includes a rotating unit 801. The rotating structure 80 and the device body 90 are connected via the rotating unit 801. The rotating structure 80 rotates on a side of the device body 90 through the rotating unit 801.

The rotating unit 801 is the same as the rotation axis in the first and second embodiments of the invention. It is understandable that the rotating unit of the USB device in the embodiment of the invention may be a gear driven or spring-driven rotating unit. The rotating unit of the USB device in the embodiment of the invention is not limited.

A holding groove 901 is configured on the device body 90. The USB plug 70 and the rotating structure 80 can be held in the holding groove 901 through rotation to integrate with the device body 90.

With a rotation axis that includes such parts as the sleeve, elastic body, indented washer, and movable support, the USB device provided according to the embodiment of the invention can rotate by any angle and be characterized by simple structure, small size, low cost, and good reliability.

It will be appreciated that the foregoing embodiments are merely examples of the inventive principles, and that these illustrate only preferred techniques. It is thus contemplated that other implementations of the invention may differ in detail from foregoing examples. As such, all references to the invention are intended to reference the particular example of the invention being discussed at that point in the description and are not intended to imply any limitation as to the scope of the invention more generally. All language of distinction and disparagement with respect to certain features is intended to indicate a lack of preference for those features, but not to exclude such from the scope of the invention entirely unless otherwise indicated.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A rotation axis arrangement, comprising a sleeve, an elastic body, an indented washer, a movable support, and a stop ring, wherein:
   the sleeve comprises a lip and a cylinder;
   the elastic body, the indented washer, and the movable support are positioned sequentially around the cylinder with the lip adjacent to the elastic body along an axial direction of the cylinder beginning with the lip;
   a surface of the indented washer that contacts a surface of the movable support is configured with a number of concave indents, wherein the concave indents are distributed in a circle;
   the surface of the movable support contacting the indented washer is configured with a number of protrusions, wherein the protrusions correspond to the concave indents on the surface of the indented washer;
   the stop ring is positioned around the cylinder and adjacent to the movable support along an axial direction on the opposite side relative to the indented washer and a stop groove is configured on the stop ring;
   an end-surface of the movable support that contacts the stop ring is configured with a positioning rod; and
   the stop groove limits the movement of the positioning rod of the movable support to a predetermined range of angles.

2. The rotation axis arrangement of claim 1, further comprising a positioning support, wherein:
   the positioning support is positioned around the cylinder and adjacent to the stop ring along the axial direction on the opposite side relative to the movable support, and the positioning support is configured with at least one positioning hole.

3. The rotation axis arrangement of claim 2, further comprising a locking washer, wherein: the locking washer is positioned around the cylinder and adjacent to the positioning support along the axial direction on the opposite side relative to the stop ring.

4. The rotation axis arrangement of claim 3, wherein the elastic body, the indented washer, and the movable support are configured around the cylinder with clearance fits; and
   the stop ring, the positioning support, and the locking washer are configured around the cylinder with interference fits.

5. The rotation axis arrangement of claim 4, wherein a number of positioning surfaces are configured on an outer surface of the cylinder; and
   other positioning surfaces are configured on a number of inner surfaces of the indented washer, the stop ring, the positioning support, and the locking washer that contact the positioning surfaces of the cylinder.

6. The rotation axis arrangement of claim 1, wherein the elastic body is initially compressed.

7. The rotation axis arrangement of claim 1, wherein a through-hole is configured in the middle of the cylinder.

8. The rotation axis arrangement of claim 1, wherein at least one positioning hole is configured on the movable support.

9. A digital device, comprising:
   a rotation axis, wherein the rotation axis includes a sleeve, an elastic body, an indented washer, a movable support, and a stop ring; and
   a rotating structure coupled to the rotation axis;
   wherein:
   the sleeve comprises a lip and a cylinder;
   the elastic body, the indented washer, and the movable support are positioned sequentially around the cylinder with the lip adjacent to the elastic body along an axial direction of the cylinder beginning with the lip;
   a surface of the indented washer that contacts a surface of the movable support is configured with a number of concave indents, wherein the concave indents are distributed in a circle;
   the surface of the movable support contacting the indented washer is configured with a number of protrusions, wherein the protrusions correspond to the concave indents on the surface of the indented washer;
   the stop ring is positioned around the cylinder and adjacent to the movable support along the axial direction on the opposite side relative to the indented washer and a stop groove is configured on the stop ring;
   the end-surface of the movable support that contacts the stop ring is configured with a positioning rod; and
   the stop groove limits the movement of the positioning rod of the movable support to a certain range of angles.

10. The digital device of claim 9, further comprising a positioning support and a locking washer, wherein:
    the positioning support is positioned around the cylinder and adjacent to the stop ring along the axial direction on the opposite side relative to the movable support, and the positioning support is configured with at least one positioning hole; and
    the locking washer is positioned around the cylinder and adjacent to the positioning support along the axial direction on the opposite side relative to the stop ring.

11. The digital device of claim 10, wherein the elastic body, the indented washer, and the movable support are configured around the cylinder with clearance fits; and
    the stop ring, the positioning support, and the locking washer are configured around the cylinder with interference fits.

12. The digital device of claim 11, wherein a number of positioning surfaces are configured on an outer surface of the cylinder; and
    other positioning surfaces are configured on a number of inner surfaces of the indented washer, the stop ring, the positioning support, and the locking washer that contact the positioning surfaces of the cylinder.

13. The digital device of claim 9, wherein the digital device is a Universal Serial Bus (USB) device, a data card, or a mobile phone.

14. A Universal Serial Bus (USB) device, comprising a USB plug, a rotating structure, and a device body, wherein:
- the USB plug is fixedly connected to the rotating structure; the rotating structure comprises a rotating unit; the rotating structure and the device body are connected via the rotating unit; and the rotating structure rotates on a side of the device body through the rotating unit;
- the rotating unit is a rotation axis comprising a sleeve, an elastic body, an indented washer a movable support, and a stop ring, wherein:
- the sleeve comprises a lip and a cylinder; the elastic body, the indented washer, and the movable support are positioned sequentially around the cylinder with the lip adjacent to the elastic body along an axial direction of the cylinder beginning with the lip;
- the surface of the indented washer that contacts the surface of the movable support is configured with a first number of concave indents, wherein the concave indents are distributed in a circle;
- the surface of the movable support contacting the indented washer is configured with a second number of protrusions, wherein the protrusions correspond to the concave indents on the surface of the indented washer;
- the stop ring is positioned around the cylinder and adjacent to the movable support along the axial direction on the opposite side relative to the indented washer and a stop groove is configured on the stop ring;
- the end-surface of the movable support that contacts the stop ring is configured with a positioning rod; and
- the stop groove limits the movement of the positioning rod of the movable support to a certain range of angles.

15. The USB device of claim 14, wherein a holding groove is configured on the device body, and the USB plug and the rotating structure are held in the holding groove through rotation to integrate with the device body.

* * * * *